(12) United States Patent
Kim et al.

(10) Patent No.: US 8,531,910 B2
(45) Date of Patent: Sep. 10, 2013

(54) INPUT BUFFER CIRCUIT, SEMICONDUCTOR MEMORY DEVICE AND MEMORY SYSTEM

(71) Applicants: Hyoung-Seok Kim, Hwaseong-si (KR); Kwan-Yong Jin, Hwasung (KR)

(72) Inventors: Hyoung-Seok Kim, Hwaseong-si (KR); Kwan-Yong Jin, Hwasung (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/654,723

(22) Filed: Oct. 18, 2012

(65) Prior Publication Data

US 2013/0039142 A1 Feb. 14, 2013

Related U.S. Application Data

(63) Continuation of application No. 12/851,718, filed on Aug. 6, 2010, now Pat. No. 8,295,122.

(30) Foreign Application Priority Data

Aug. 7, 2009 (KR) .................. 10-2009-0072734

(51) Int. Cl.
*G11C 8/00* (2006.01)

(52) U.S. Cl.
USPC ............. 365/233.14; 365/233.1; 365/233.11; 365/189.05

(58) Field of Classification Search
USPC ................ 365/233.14, 233.1, 233.11, 189.05
See application file for complete search history.

(56) References Cited

U.S. PATENT DOCUMENTS

| 5,808,486 A | 9/1998 | Smiley |
| 6,697,296 B2 * | 2/2004 | Matsumoto et al. ..... 365/189.16 |

FOREIGN PATENT DOCUMENTS

| JP | 2000-148284 | 5/2000 |
| KR | 1020060128121 A | 12/2006 |
| KR | 100839505 B1 | 6/2008 |

* cited by examiner

*Primary Examiner* — Jason Lappas
(74) *Attorney, Agent, or Firm* — Volentine & Whitt, PLLC

(57) ABSTRACT

An input buffer circuit includes a logic unit, a clock enable buffer, and a clock buffer. The logic unit is configured to receive a clock signal and a clock enable signal, and to output a decision signal indicative of whether the clock signal is normally input, where the decision signal is activated when the clock signal is normally input. The clock enable buffer is configured to buffer the clock enable signal and to activate an internal clock enable signal, in response to an activation of the decision signal. The clock buffer is configured to buffer the clock signal and to output an internal clock signal, in response to an activation of the internal clock enable signal.

11 Claims, 8 Drawing Sheets

INPUT BUFFER CIRCUIT, SEMICONDUCTOR MEMORY DEVICE AND MEMORY SYSTEM

CROSS-REFERENCE TO RELATED APPLICATIONS

This application is a Continuation of application Ser. No. 12/851,718, filed Aug. 6, 2010, of which claim of priority under 35 USC §119 is made to Korean Patent Application No. 2009-0072734, filed on Aug. 7, 2009 in the Korean Intellectual Property Office (KIPO), the contents of which are herein incorporated by reference in their entirety.

BACKGROUND

Example embodiments relate to semiconductor devices, more particularly, to input buffer circuits and to semiconductor memory devices and memory systems including buffer circuits.

In general, semiconductor memory devices receive external clock signals, and operate based on the clock signals as reference timing. For example, synchronous dynamic random access memories (DRAMs) read and write data in synchronization with the external clock signal. Input of the clock signal and commands to the semiconductor memory device is controlled by a clock enable signal. When the clock enable signal is input to the semiconductor memory device before the clock signal is input to the semiconductor memory device (due to various factors such as noise), the semiconductor memory device may operate according to an incorrect command.

SUMMARY

According to some example embodiments, an input buffer circuit of a semiconductor memory device is provided which includes a logic unit, a clock enable buffer, and a clock buffer. The logic unit is configured to receive a clock signal and a clock enable signal, and to output a decision signal indicative of whether the clock signal is normally input, where the decision signal is activated when the clock signal is normally input. The clock enable buffer is configured to buffer the clock enable signal and to activate an internal clock enable signal, in response to an activation of the decision signal. The clock buffer is configured to buffer the clock signal and to output an internal clock signal, in response to an activation of the internal clock enable signal.

According to some example embodiments, a semiconductor memory device is provided which includes a memory core unit that includes a memory cell array, and a buffer unit that includes a plurality of buffers configured to provide an internal address and internal control signals to the memory core unit in synchronization with an internal clock signal. The semiconductor memory device further includes an input buffer circuit which includes a clock enable buffer and a clock buffer. The clock enable buffer is configured to activate an internal clock enable signal, in response to a clock signal and a clock enable signal, the internal clock enable signal being activated when the clock signal is normally input. The clock buffer is configured to buffer the clock signal to provide the internal clock signal, in response to an activation of the internal clock enable signal.

According to some example embodiments, a memory system is provided which includes a plurality of memory modules, and a memory controller configured to generate clock enable signals to each of the memory modules to control an operation of each of the memory modules. Each of the memory modules includes a logic unit, a clock enable buffer and a clock buffer. The logic unit is configured to output a decision signal indicating whether a clock signal is normally input, in response to the clock signal and the clock enable signal, where the decision signal is activated when the clock signal is normally input. The clock enable buffer is configured to buffer the clock enable signal and to activate an internal clock enable signal, in response to an activation of the decision signal. The clock buffer is configured to buffer the clock signal to output the internal clock signal, in response to an activation of the internal clock enable signal.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
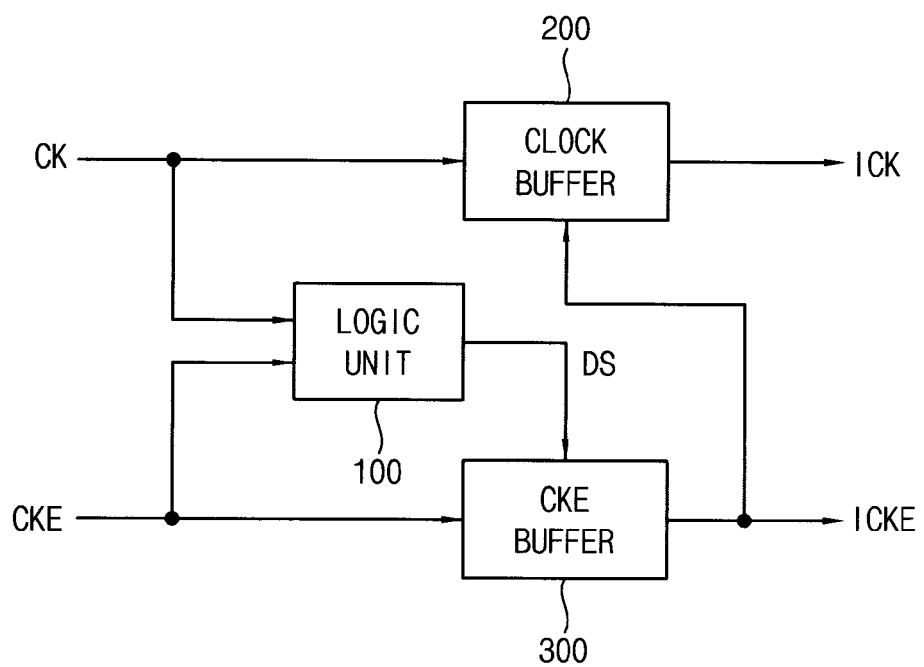
FIG. 1 is a block diagram illustrating an example of an input buffer circuit according to some example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an example of an input buffer circuit according to some example embodiments.

Referring to FIG. 1, an input buffer circuit 10 includes a logic unit 100, a clock enable buffer (CKE buffer) 300 and a clock buffer 200.

The logic unit 100 generates a decision signal DS indicating whether or not a clock signal CK is normally input in response to the clock signal CK and a clock enable signal CKE. That is, the logic unit 100 receives the clock signal CK and the clock enable signal CKE, and provides an "activated" decision signal DS when the clock signal CK is normally input. For example, the activated decision signal DS can be denoted by a given logic state, and in this case, a determination as to whether or not the clock signal CK is normally input is based on a logic level of the decision signal DS. As a specific example, when the clock enable signal CKE is activated before the clock signal CK is normally input, the decision signal DS is first logic level (i.e., logic low level).

The clock enable buffer 300 buffers the clock enable signal CKE to provide an internal clock enable signal ICKE, in response to an activation of the decision signal DS. That is, the clock enable buffer 300 provides the internal clock enable signal ICKE that is activated when the clock signal CK is normally input.

The clock buffer 200 buffers the clock signal CK to provide the internal clock signal ICK, in response to an activation of the internal clock enable signal ICKE. A semiconductor memory device operates in synchronization with the internal clock signal ICK. Since the clock buffer 200 buffers the clock signal CK to provide the internal clock signal ICK when the decision signal DS is activated (when the decision signal DS is second logic level (i.e., logic high level)), the semiconductor memory device may be prevented from operating abnormally when the clock signal CK is not input normally.

The clock signal CK may, for example, be a differential signal or a single-ended signal.

Figure 2A:
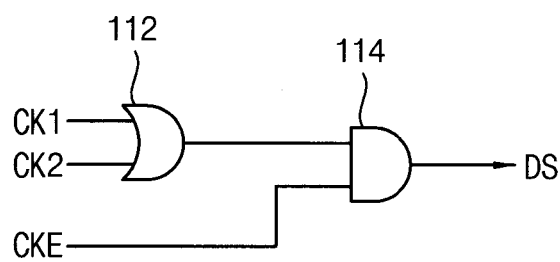
FIG. 2A illustrates an example of the logic unit in FIG. 1 according to some example embodiments.

FIG. 2A illustrates an example of the logic unit shown in FIG. 1 according to some example embodiments. In particular, FIG. 2A illustrates an example of the logic unit in FIG. 1 in the case where the clock signal CK is a differential signal.

Referring to FIG. 2A, a logic unit 110 includes an OR gate 112 that receives differential clock signals CK1 and CK2, and an AND gate 114 that performs an AND operation on an output of the OR gate 112 and the clock enable signal CKE to provide the decision signal DS according to a result of the AND operation. The OR gate 112 receives the differential clock signals CK1 and CK2 and performs an OR operation on the differential clock signals CK1 and CK2. Accordingly, when the differential clock signals CK1 and CK2 are normally input, the output of the OR gate 112 is a logic high level. Therefore, the decision signal DS is a logic high level only when the output of the OR gate 112 is a logic high level, and thus, malfunction may be prevented even when the clock enable signal CKE is activated before the differential clock signals CK1 and CK2 are normally input.

Figure 2B:
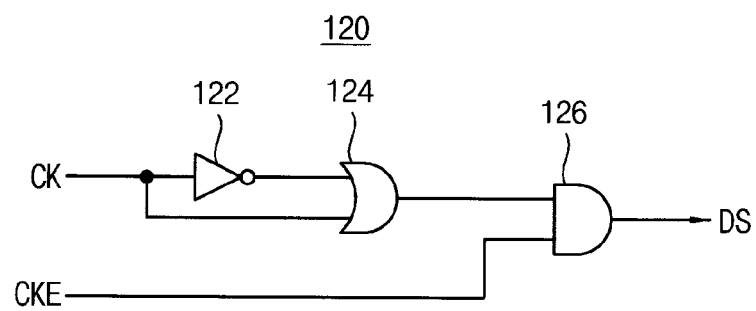
FIG. 2B illustrates an example of the logic unit in FIG. 1 according to some example embodiments.

FIG. 2B illustrates an example of the logic unit in FIG. 1 according to some example embodiments. In particular, FIG. 2B illustrates an example of the logic unit in FIG. 1 in the case where the clock signal CK is a single-ended signal.

Referring to FIG. 2B, a logic unit 1200 includes an inverter 122, an OR gate 124 and an AND gate 126. The inverter 122 inverts the clock signal CK. The OR gate performs an OR operation on an output of the inverter 122 and the clock signal 124. The AND gate 126 performs an AND operation on an output of the OR gate 124 and the clock enable signal CKE to provide the decision signal DS according to a result of the AND operation. Accordingly, when the clock signal CK is normally input, the output of the OR gate 122 is a logic high level. Therefore, the decision signal DS is a logic high level only when the output of the OR gate 124 is a logic high level. In this manner, malfunction may be prevented when the clock enable signal CKE is activated before the clock signal CK is normally input.

Figure 3:
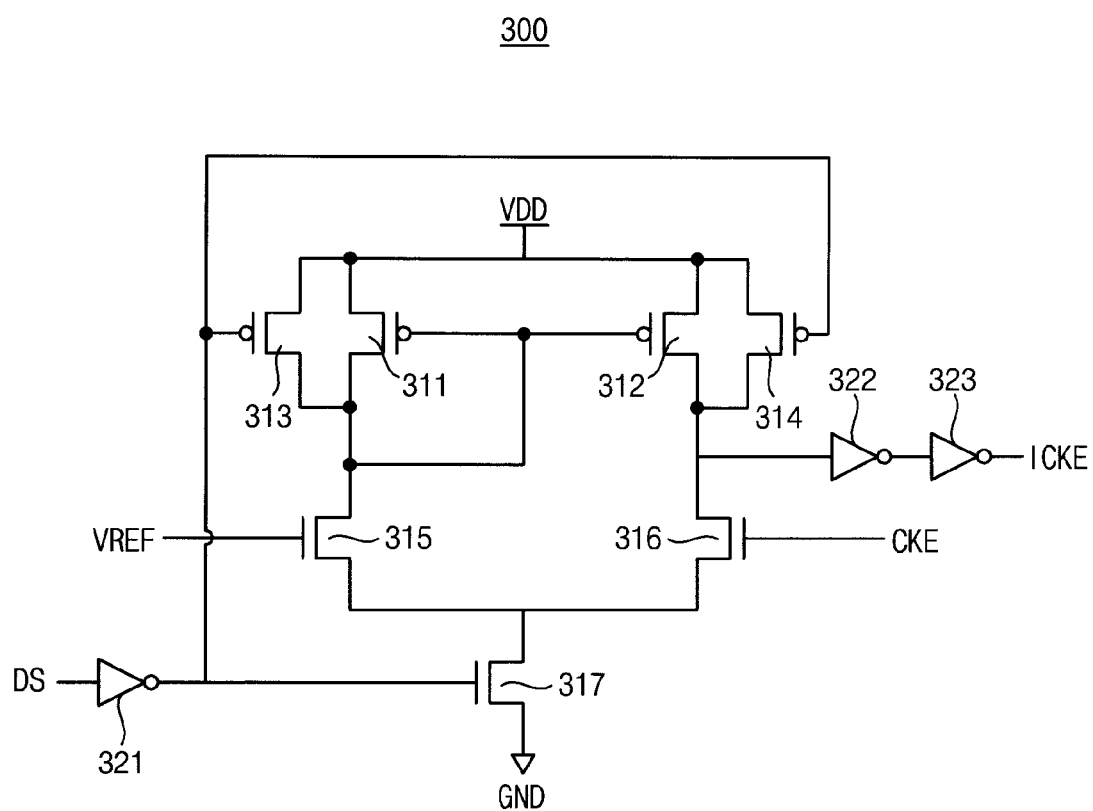
FIG. 3 is a circuit diagram illustrating an example of the clock enable buffer in FIG. 1 according to some example embodiments.

FIG. 3 is a circuit diagram illustrating an example of the clock enable buffer in FIG. 1 according to some example embodiments.

Referring to FIG. 3, a clock enable buffer 300 includes n-channel metal oxide semiconductor (NMOS) transistors 315 and 316 which respectively receive a reference signal VREF and the clock enable signal CKE, and a NMOS transistor 317 which has a gate receiving an inverted decision signal DS from an inverter 321, a drain connected to sources of the NMOS transistors 315 and 316 and a source connected to a ground voltage (GND). The clock enable buffer 300 further includes p-channel metal oxide semiconductor (PMOS) transistors 313, 314, 315 and 316 and inverters 322 and 323. The PMOS transistor 311 has a source connected to a power supply voltage VDD and a diode-connected gate that is connected to a gate of the PMOS transistor 312. The PMOS transistors 311 and 312 form a current mirror. The PMOS transistor 313 has a source connected to the power supply voltage VDD, a drain connected to a drain of the PMOS transistor 311 and a gate receiving the inverted decision signal DS. The PMOS transistor 314 has a source connected to the power supply voltage VDD, a gate receiving the inverted decision signal DS and a drain connected to an input of the inverter 322. The input of the inverter 322 is connected to the drains of the PMOS transistors 312 and 314, and the inverter 323 inverts an output of the inverter 322 to provide the internal clock enable signal ICKE. In the example of FIG. 3, the clock enable signal CKE is buffered to be provided as the internal clock enable signal ICKE only when the decision signal DS is logic high level (that is, the clock signal CK is normally input).

The input buffer circuit 100 of FIG. 1 illustrates a configuration of an input buffer circuit included in a semiconductor memory device when the semiconductor memory device is in normal operation mode.

In a power-up mode when a power supply voltage is initially applied to the semiconductor memory device, the clock enable signal CKE may be activated thereby to cause malfunction of the semiconductor memory device due to external noises before the power supply voltage reaches a target level.

Figure 4:
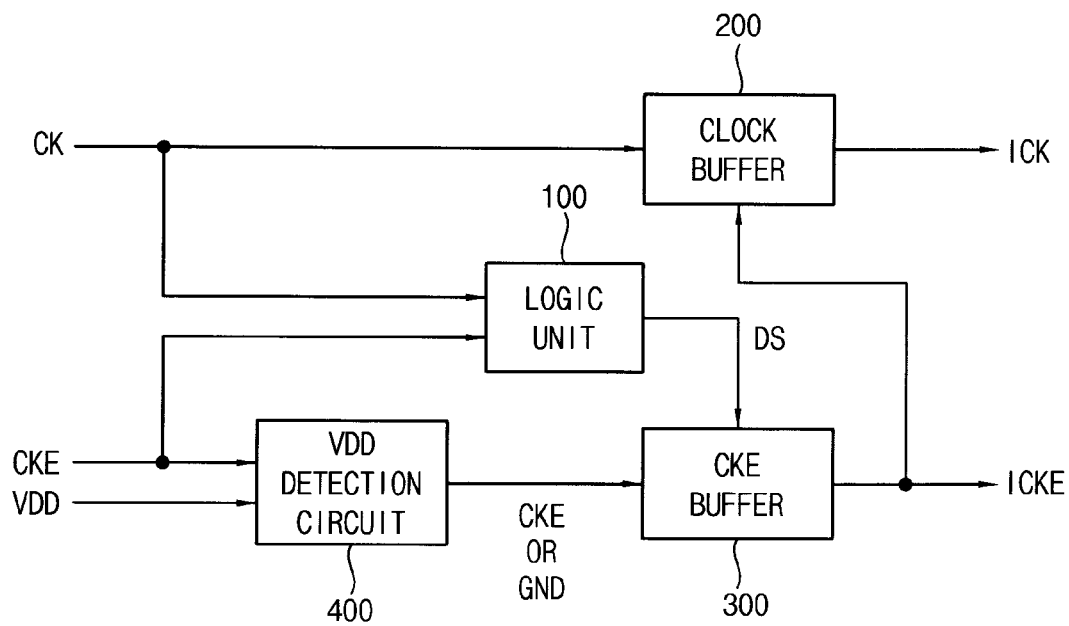
FIG. 4 is a block diagram illustrating an example of an input buffer circuit according to other example embodiments.

FIG. 4 is a block diagram illustrating an example of an input buffer circuit according to other example embodiments.

An input buffer circuit 20 of FIG. 4 is an input buffer circuit when the power-up mode of the semiconductor memory device is considered.

Referring to FIG. 4, the input buffer circuit 20 includes the logic unit 100, the clock enable buffer 300 and the clock buffer 200 also included in the input buffer circuit 10 of FIG. 1. The example of FIG. 4 differs from that of FIG. 1 in that the input buffer circuit 20 further includes a voltage level detection circuit 400. Operations of the logic unit 100, the clock enable buffer 300 and the clock buffer 200 have already been described with reference to FIG. 1.

The voltage level detection circuit 400 may selectively provide the clock enable signal CKE to the clock enable buffer 300 according to a level of a power supply voltage VDD in the power-up mode when the power supply voltage VDD is initially applied to the semiconductor memory device.

Figure 5:
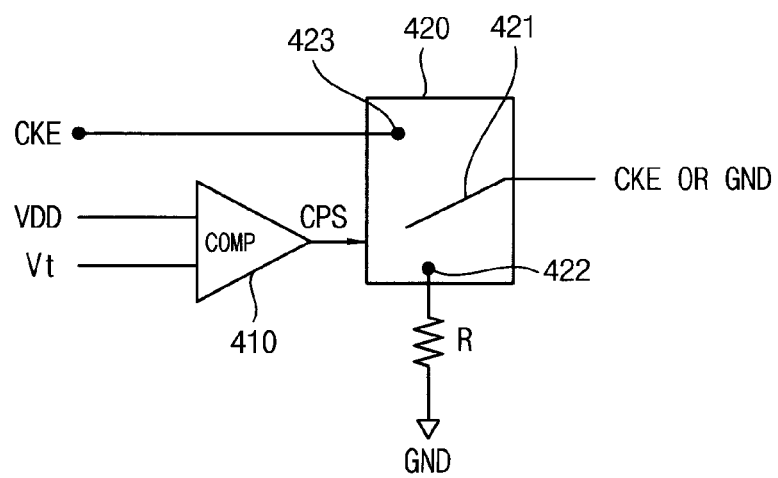
FIG. 5 is a circuit diagram illustrating an example of the voltage level detection circuit 400 in FIG. 4 according to some example embodiments.

FIG. 5 is a circuit diagram illustrating an example of the voltage level detection circuit 400 in FIG. 4 according to some example embodiments.

Referring to FIG. 5, the voltage level detection circuit 400 includes a comparator (COMP) 410, a switching unit 420 and a resistor R. The comparator 140 compares a level of the power supply voltage VDD and a target level Vt to provide a comparison signal CPS based on the comparison result. For example, when the level of the power supply voltage VDD is lower than the target level Vt, the comparison signal CPS may be a first logic level (i.e., logic low level). Also for example, when the level of the power supply voltage VDD is equal to or higher than the target level Vt, the comparison signal CPS may be a second logic level (i.e., logic high level).

The switching unit 420 may include a switch 421 which is controlled in response to the comparison signal CPS. For example, when the level of the power supply voltage VDD is lower than the target level Vt, and thus, the comparison signal CPS is a logic low level, the switch 421 is connected to a terminal 422. Therefore, the clock enable buffer 300 is pulled-down to the ground voltage GND. Also for example, when the level of the power supply voltage VDD is equal to or higher than the target level Vt, and thus the comparison signal CPS is logic high level, the switch 421 is connected to a terminal 423. Therefore, the clock enable signal CKE is provided to the clock enable buffer 300. The voltage level detection circuit 400 pulls-down the clock enable buffer 300 to the ground voltage GND when the level of the power supply voltage VDD is lower than the target level Vt and thus, abnormal input of the clock enable signal CKE to the clock enable buffer 300 due to noises may be prevented. When the level of the power supply voltage VDD is equal to or higher than the target level Vt, the clock enable signal CKE is continuously provided to the clock enable buffer 330, and the input buffer circuit 20 operates in a same manner as the input buffer circuit 10 of FIG. 1.

Figure 6:
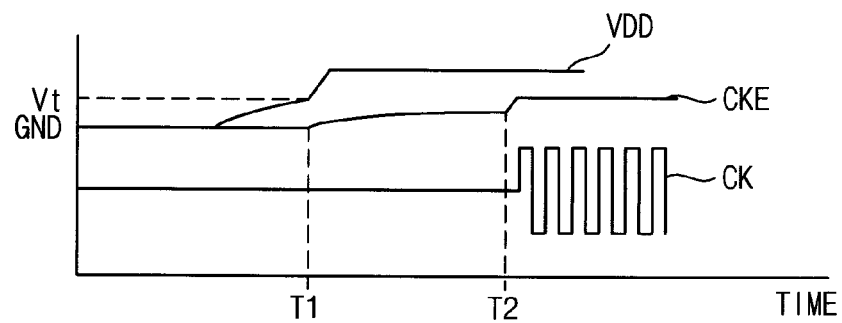
FIG. 6 is a waveform diagram illustrating an operation of the input buffer circuit 20 of FIG. 4.

FIG. 6 is a waveform diagram illustrating an operation of the input buffer circuit 20 of FIG. 4.

Referring to FIG. 6, the clock enable buffer 300 is pulled-down to the ground voltage GND before a time when the level of the power supply voltage VDD is lower than the target level Vt. The clock enable signal CKE is not pulled-down to the ground voltage VDD while the clock enable signal CKE is not activated during a time interval T1~T2, i.e., when the level of the power supply voltage VDD is higher than the target level Vt and the clock signal CK is not (normally) input. The clock enable signal CKE is activated after a time T2 when the level of the power supply voltage VDD is higher than the target level Vt and the clock signal CK is normally input.

Although FIG. 6 illustrates an operation of the input buffer circuit 20 of FIG. 4, FIG. 6 may illustrate operation of the input buffer circuit 10 of FIG. 1 with respect the operations executed after the time T1.

Figure 7:
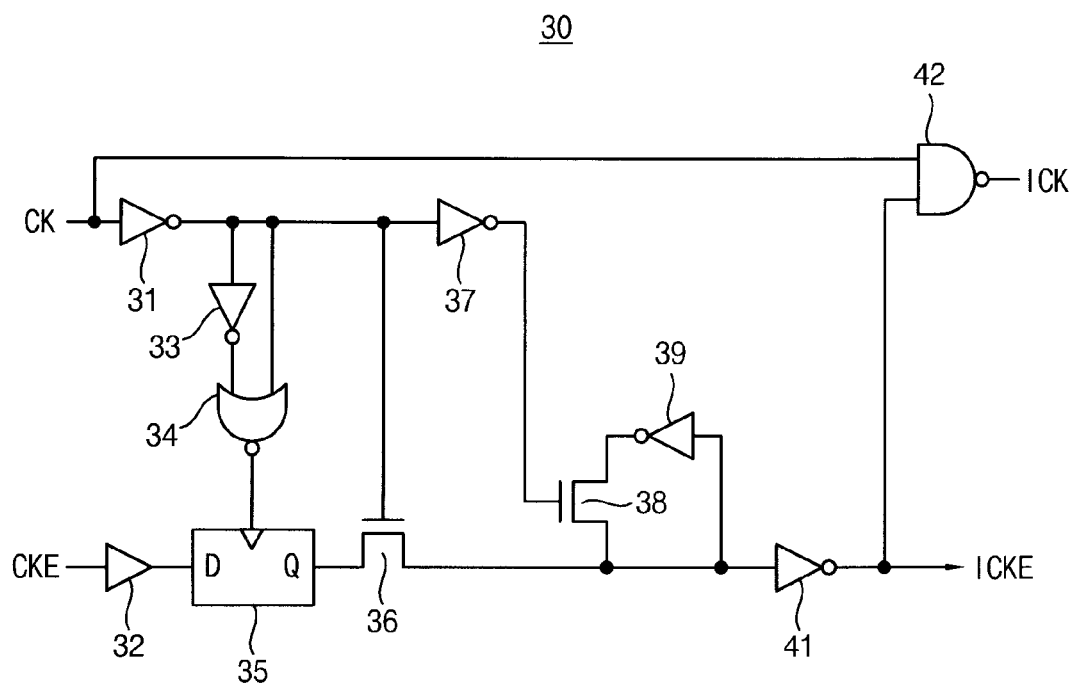
FIG. 7 is a block diagram illustrating an example of an input buffer circuit according to still other example embodiments.

FIG. 7 is a block diagram illustrating an example of an input buffer circuit according to still other example embodiments.

Referring to FIG. 7, an input buffer circuit 30 includes inverters 31, 33, 37, 39 and 41, a buffer 32, a NOR gate 34, a NAND gate 42, a flip-flop 35 and transistors 36 and 38. The inverter 31 inverts the clock signal CK. The buffer 32 buffers the clock enable signal CKE to be provided to the flip-flop 35. The inverter 33 inverts output of the inverter 31. The NOR gate 34 performs a NOR operation on outputs of the inverts 31 and 33. The flip-flop 35 transfers the buffered clock enable signal CKE to a first electrode of the transistor 36 in synchronization with the output of the NOR gate 34. The inverter 37 inverts the output of the inverter 31, and output of the inverter 37 is applied to a gate of the transistor 38. The transistor 38 has a first electrode connected to a second electrode of the transistor 36 and an input of the inverter 39, and a second electrode connected to an output of the inverter 39. An input of the inverter 41 is connected to the input of the inverter 39, and the inverter 41 provides the internal clock enable signal ICKE.

The NAND gate 42 performs a NAND operation on the clock signal CK and the internal clock enable signal ICKE to provide the internal clock signal ICK. The input buffer circuit 30 converts the clock signal CK to the internal clock signal ICKE under the control of the clock enable signal CKE. In addition, the clock enable signal CKE which is asynchronously input, is converted to the internal clock enable signal ICKE by being strobed by the clock signal CK. That is, the input buffer circuit 30 generates the internal clock signal ICK by controlling the clock signal CK by the internal clock enable signal ICKE.

Figure 8:
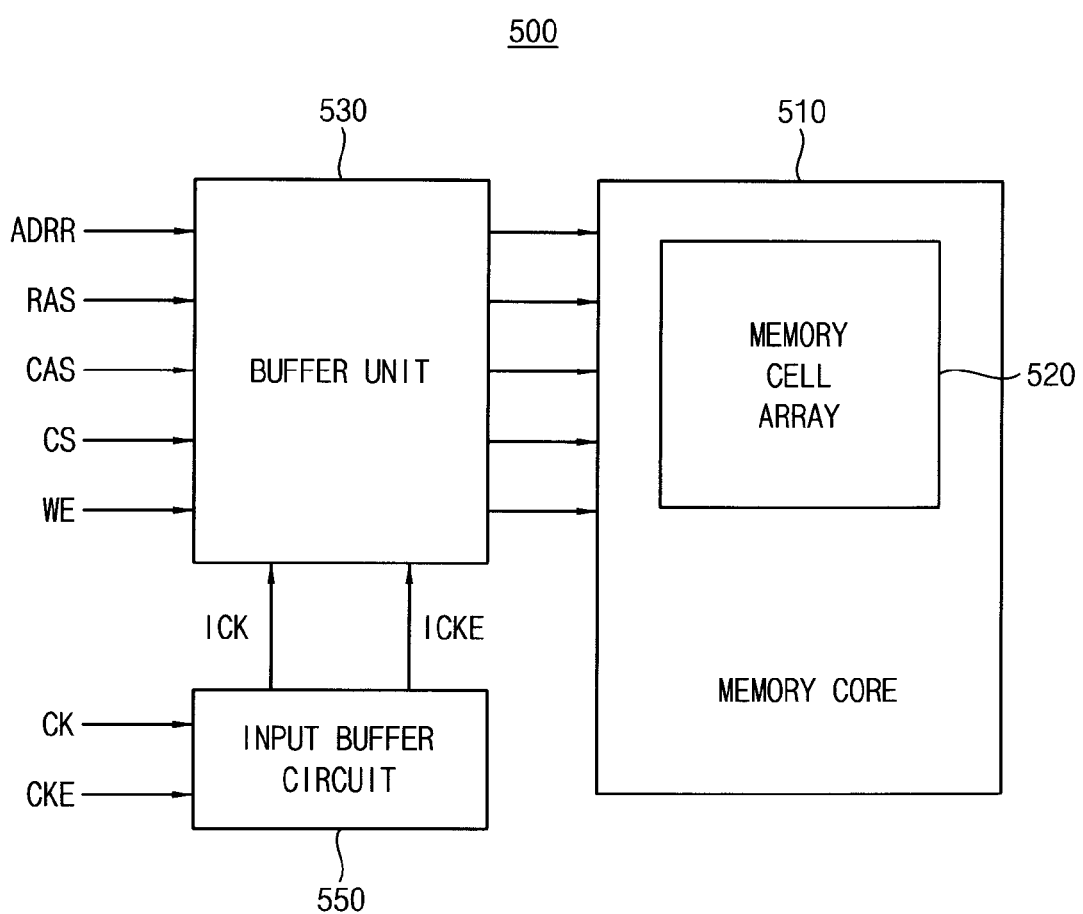
FIG. 8 is a block diagram illustrating an example of a semiconductor memory device according to example embodiments.

FIG. 8 is a block diagram illustrating an example of a semiconductor memory device according to example embodiments.

Referring to FIG. 8, a semiconductor memory device 500 includes a memory core unit 510 having a memory cell array 520, a buffer unit 530 and an input buffer circuit 550.

Although not illustrated, the memory core unit 510 may include various other elements for writing/reading data to/from the memory cell array 520. For example, the memory core unit 510 may include a sense amplifier, a column decoder, and a row decoder.

Figure 9:
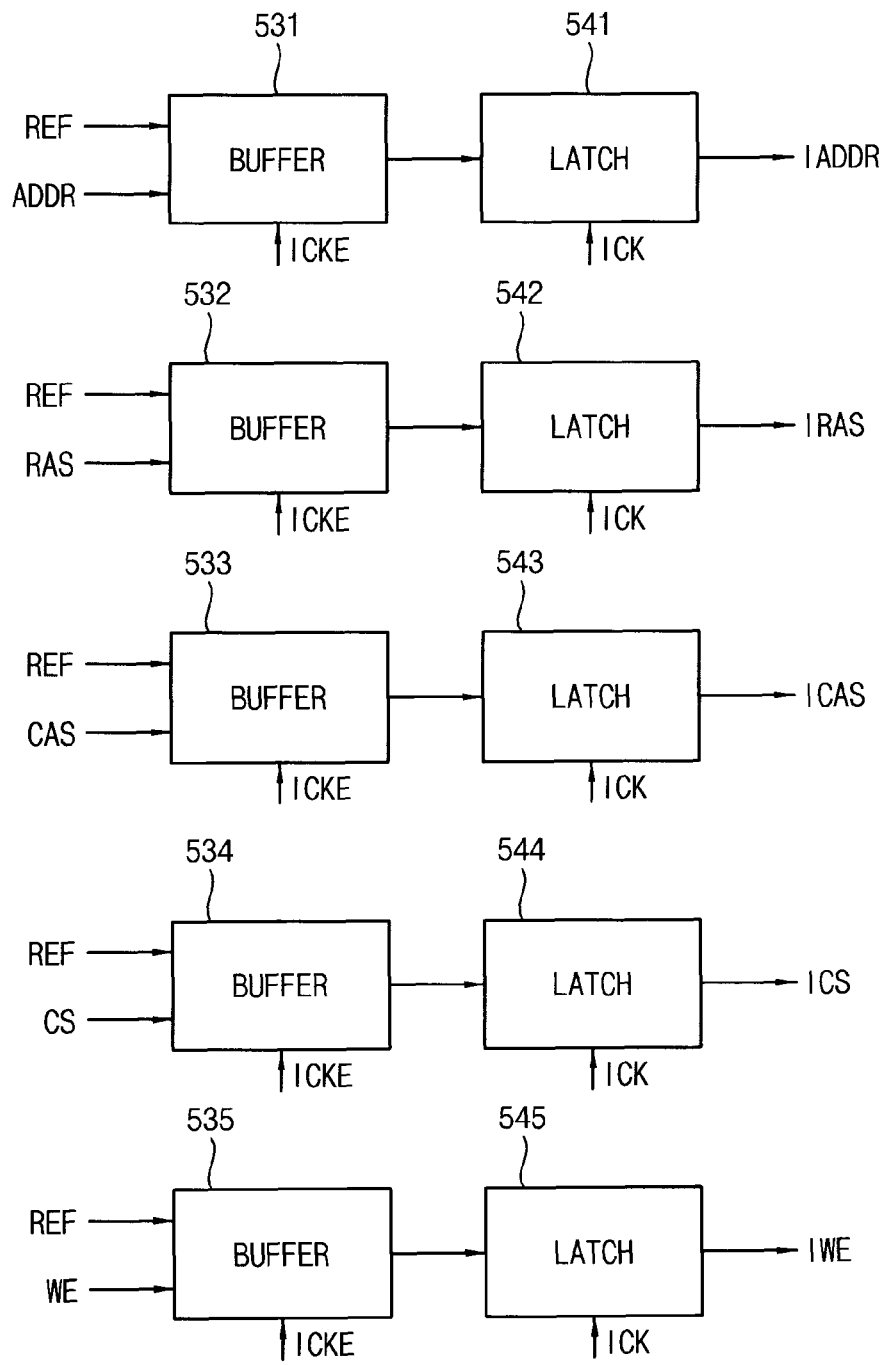
FIG. 9 is a block diagram illustrating an example of the buffer unit in FIG. 8 according to example embodiments.

FIG. 9 is a block diagram illustrating an example of the buffer unit in FIG. 8 according to example embodiments.

Referring to FIG. 9, the buffer unit 530 includes a plurality of buffers 531~535 and a plurality of latches 541~545.

Hereinafter, there will be a detailed description of the semiconductor memory device 500 with reference to FIGS. 8 and 9.

Each of the buffers 531~535 compares an address ADDR and control signals RAS, CAS, CS, and WE with a reference signal REF and buffers the address signal ADDR and the control signals RAS, CAS, CS, and WE in response to an activation of the internal clock enable signal ICKE. Each of the latches 541~545 latches respective outputs of the buffers 531~535 in synchronization with the internal clock signal ICK to provide an internal address IADDR and internal control signals IRAS, ICAS, ICS and IWE.

The input buffer circuit 550 may employ the input buffer circuit 10 of FIG. 1. Therefore, the input buffer circuit 550 may include the clock enable buffer 300 that buffers the clock enable signal CKE to provide an internal clock enable signal ICKE that is activated when the clock signal CK is normally input, in response to the clock signal CK and the clock enable signal CKE, and the clock buffer 200 that buffers the clock signal CK to provide the internal clock signal ICK, in response to an activation of the internal clock enable signal ICKE. The internal clock enable signal ICKE is provided to each of the buffers 531~535, and enablement of each of the buffers 531~535 is determined based on the internal clock enable signal ICKE. In addition, the internal clock signal ICK is provided to each of the latches 541~545, and a latch timing for each of the outputs of the buffers 531~535 is determined based on the internal clock signal ICK.

The input buffer circuit 550 may further include the logic unit 100 that provides the decision signal DS indicating whether or not the clock signal CK is normally input in response to the clock signal CK and the clock enable signal CKE. Therefore, the clock enable buffer 300 buffers the clock enable signal CKE to provide the internal clock enable signal ICKE, in response to an activation of the decision signal DS.

The input buffer circuit 550 may be included in a semiconductor memory device or may be included in a memory module which having a plurality of semiconductor memory devices.

Figure 10:
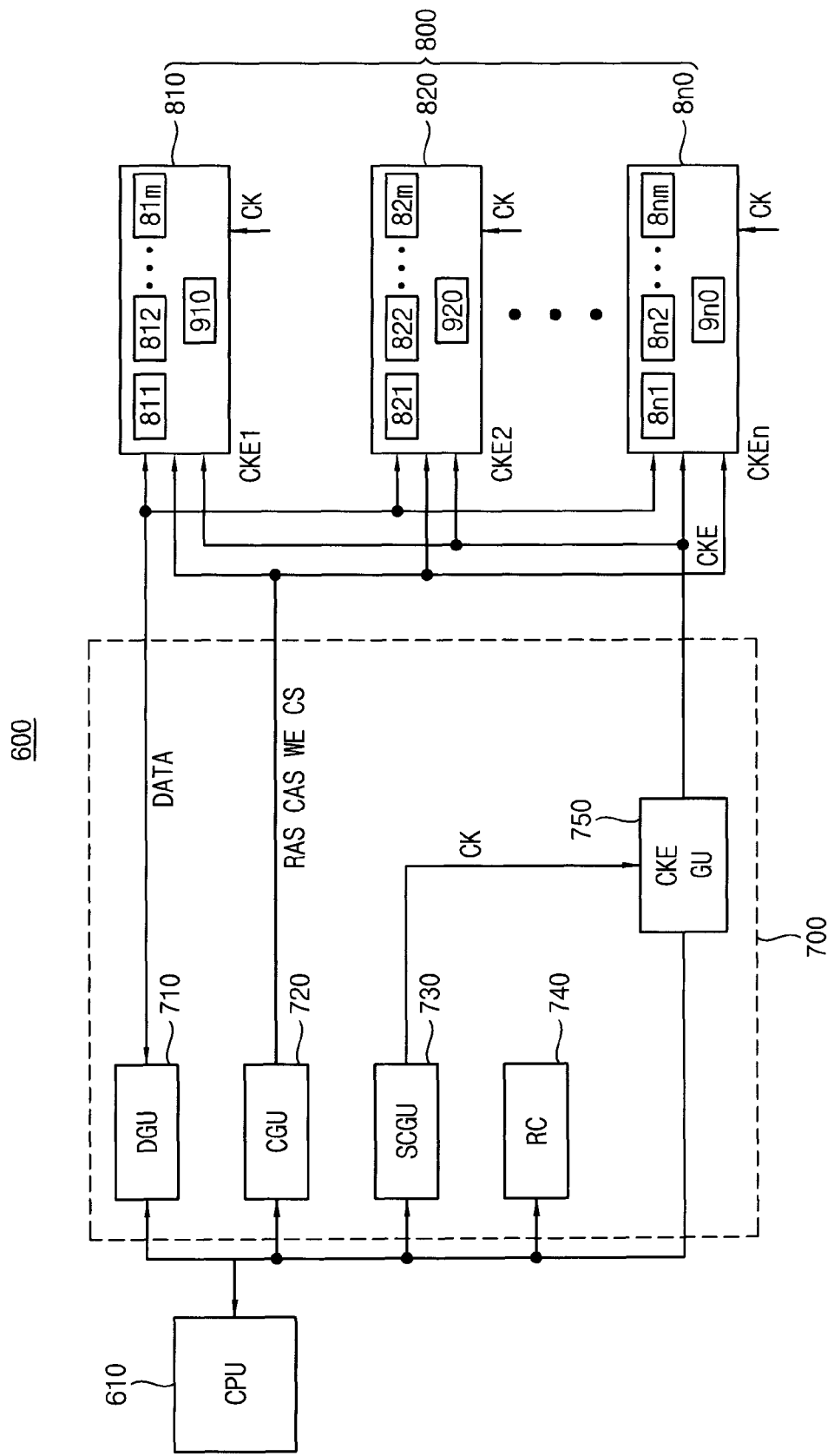
FIG. 10 is a block diagram illustrating a memory system according to some example embodiments.

FIG. 10 is a block diagram illustrating a memory system according to some example embodiments.

Referring to FIG. 10, a memory system 600 includes a central process unit (CPU) 610, a memory controller 700 and a memory 800 having a plurality of memory modules 810, 820, ..., 8n0. The memory system 600 may be implemented with various configurations such as an electronic device, a computing system, a computer and a terminal device. The memory controller 700 writes and/or reads data to and/or from the memory 800 under the control of the CPU 610.

Each of the memory modules 810~8n0 may includes each of memory devices 811~81m, 821~82m, ..., 8n1~8nm and each of a plurality of buffer circuits 910-9n0. Each of the memory devices 8n1~8nm of the memory devices 811~81m, 821~82m, ..., 8n1~8nm are non-volatile memory devices, each storing operating characteristics of each of the memory modules 810~8n0. Other memory devices 811~81m, 821~82m, ... are volatile memory devices.

The operating characteristics may include RAS to CAS, CAS latency, refresh period, access time required for accessing the memory 900, a precharge time, a memory capacity and a number of memory rows and columns.

Each of the memory modules 810~8n0 may includes each of buffer circuits 910~9n0. Each of the buffer circuits 910~9n0 may include the buffer unit 530 and the input buffer circuit 550 in FIG. 8 in some embodiments. Each of the buffer circuit 910~9n0 may include the input buffer circuit 550 in FIG. 8 and each of memory devices 811~81m, 821~82m, ..., 8n1~8nm may include the buffer unit 530 in FIG. 8 in other embodiments. Each of memory devices 811-81m, 821~82m, ..., 8n1~8nm may include the buffer unit 530 and the input buffer circuit 550 in FIG. 8 in other embodiments.

The memory controller 600 controls each of the memory modules 810~8n0 according to characteristic of the data being processed. The memory controller 600 includes a data generating unit (DGU) 710, a command generating unit (CGU) 720, a synchronization clock generating unit (SCGU) 730, a refresh controller (RC) 740 and a clock enable signal generating unit (CKEGU) 750.

The SCGU 730 generates the clock signal CK. The CGU 720 generates control commands RAS, CAS, WE and CS for controlling each of the memory modules 810~8n0, in synchronization with the clock signal CK, transfers the control commands RAS, CAS, WE and CS to the memory modules 810~8n0 and locates a corresponding location of the memory 900 for inputting/outputting data.

The DGU 710 writes and/or reads data to and/or from the location of the corresponding memory module located by the CGU 720.

The refresh controller 740 controls the refresh operation such that the memory 900 is refreshed according to the refresh period of the memory 900. Each of the memory modules 810~8n0 performs the refresh operation when the clock enable signal CKE is a logic high level.

The CKEGU 750 generates the clock enable signal CKE to each of the memory modules 810~8n0. The clock enable signal CKE is generated in synchronization with the clock signal CK. Each of the memory modules 810~8n0 may receive the clock enable signal CKE having different levels, from the CKEGU 750 according to a data capacity required by the CPU 610. That is, each of the clock enable signals CKE1~CKEn may be applied to each of the memory modules 810~8n0, and each of the clock enable signals CKE1~CKEn may have different levels depending on the data capacity required by the CPU 610.

Each of the clock enable signals CKE1~CKEn may be selectively activated depending on the data capacity required by the CPU 610, and each of the memory modules 810~8n0 may be selectively enabled in response to each of the clock enable signals CKE1~CKEn. Some of the modules 810~8n0, which receive a high-level clock enable signal CKE, perform required operations under the control of the controller 700, and some of the modules 810~8n0, which receive a low-level clock enable signal CKE may enter into power-down modes. Therefore, current consumption required for driving the memory 800 may be reduced by individually controlling the memory modules 810~8n0 according to the required data capacity to be processed by the CPU 610.

Each of the buffer circuits 910~9n0 may include the input buffer circuit 550 in FIG. 8 and thus each of the buffer circuits 910~9n0 may buffer the clock enable signal CKE to provide the internal clock enable signal ICKE that is activated when the clock signal CK is normally input, and buffers the clock signal CK to provide the internal clock signal ICK, in response to an activation of the internal clock enable signal ICKE. Therefore, malfunction due to noises may be prevented because the internal clock signal ICKE is not activated before the clock signal CK is normally input even when the clock enable signal CKE is activated.

Each of the buffer circuits 910~9n0 may include the input buffer circuit 20 in FIG. 4, and thus, each of the buffer circuits 910~9n0 may admit of the clock enable signal CKE in the power-up mode, when the level of the power supply voltage VDD is equal to or higher than the target level Vt. Therefore, malfunction due to noises may be prevented.

In addition, the CKEDU 750 may employ the input buffer circuit 10 of FIG. 1 or the input buffer circuit 20 of FIG. 4. In this case, the CKEDU 750 may provide the internal clock enable signal ICKE to each of the memory modules 810~8n0.

Figure 11:
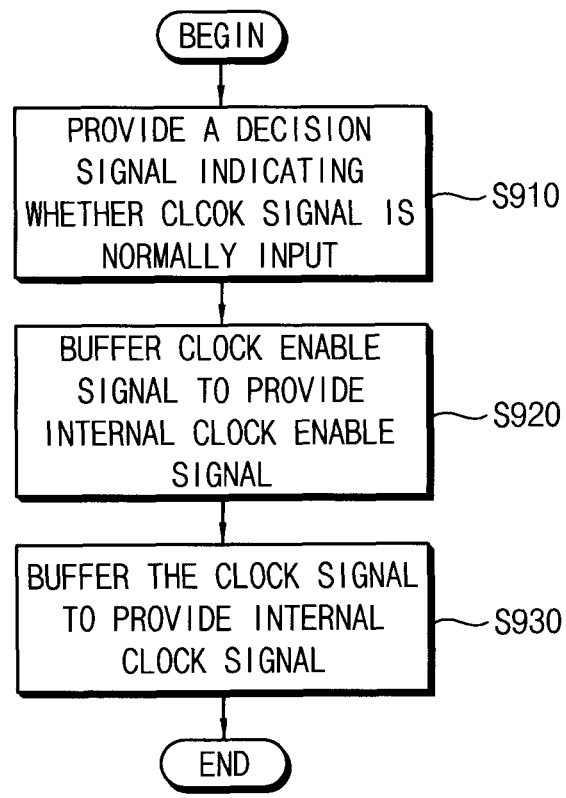
FIG. 11 is a flow chart illustrating a method of controlling a semiconductor memory device according to some example embodiments.

FIG. 11 is a flow chart illustrating a method of controlling a semiconductor memory device according to some example embodiments.

Hereinafter, there will be a description of a method of controlling a semiconductor memory device with reference to FIGS. 1 and 11.

A decision signal DS indicating whether or not a clock signal CK is normally input is provided in response to the clock signal CK and a clock enable signal CKE (S910). The decision signal DS is activated only when the clock signal CK is normally input. The clock enable signal CKE is buffered to be provided as an internal clock enable signal ICKE in response to an activation of the decision signal DS (S920). The clock signal CK is buffered to be provided as an internal clock signal ICK in response to an activation of the internal clock enable signal ICKE (S930). The semiconductor memory device operates in synchronization with the internal clock signal ICK. Therefore, abnormal operation of the semiconductor memory device may be prevented by preventing activation of the clock enable signal CKE due to noise generated when the clock signal CK is not normally input.

As mentioned above, it is prevented that the clock enable signal is activated prior to the clock signal due to noise by controlling an activation time point of the clock enable signal through the clock signal and buffering the clock signal based on the clock enable signal. Therefore, example embodiments may be applicable to various semiconductor memory devices and memory modules.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An input buffer circuit of a semiconductor memory device, comprising:
    a logic unit configured to receive a clock signal and a clock enable signal, and to output a decision signal indicative of whether the clock signal is normally input;
    a clock enable signal unit configured to receive the decision signal, and to activate an internal clock enable signal, in response to an activation of the decision signal; and
    a clock signal unit configured to output an internal clock signal, in response to an activation of the internal clock enable signal.

2. The input buffer circuit of claim 1,
    wherein the logic unit comprises:
    an AND gate that performs an AND operation on the clock signal and the clock enable signal to output the decision signal.

3. The input buffer circuit of claim 1,
    wherein the logic unit configured to output a first logic value when the clock signal is different logic value from the clock enable signal and output a second logic value when the logic value of the clock signal is high and the logic value of the clock enable signal is high.

4. A semiconductor memory device, comprising:
    a memory core unit that includes a memory cell array;
    a buffer unit that includes a plurality of buffers configured to provide an internal address and internal control signals to the memory core unit in synchronization with an internal clock signal; and
    an input buffer circuit including:
        a logic unit configured to receive a clock signal and a clock enable signal, and to output a decision signal indicative of whether the clock signal is normally input;
        a clock enable signal unit configured to receive the decision signal and to activate an internal clock enable signal, in response to the clock signal and the clock enable signal; and
        a clock signal unit configured to provide the internal clock signal, in response to an activation of the internal clock enable signal.

5. The semiconductor memory device of claim 4, wherein the logic unit outputs activated decision signal when the clock signal and the clock enable signal are logic high levels.

6. The semiconductor memory device of claim 4, wherein the logic unit outputs the decision signal having a logic low level when the clock signal and the clock enable signal have different logic levels with respect to each other.

7. The semiconductor memory device of claim 4, wherein the clock enable signal buffer is configured to output activated internal clock enable signal when the decision signal is activated.

8. A memory system comprising:
    a plurality of memory modules; and
    a memory controller configured to generate clock enable signals to each of the memory modules to control an operation of each of the memory modules,
    each of the memory modules including:
    a logic unit configured to receive the clock signal and corresponding clock enable signal and to output a corresponding decision signal indicative of whether the clock signal is normally input;
    a clock enable signal unit configured to receive the decision signal and to activate an internal clock enable signal, in response to the clock signal and the corresponding clock enable signal; and
    a clock signal unit configured to output the internal clock signal, in response to an activation of the internal clock enable signal.

9. The memory system of claim 8, wherein the logic unit outputs the corresponding decision signal which is activated when the clock signal and the corresponding clock enable signal are logic high levels.

10. The memory system of claim 8, wherein the logic unit outputs the corresponding decision signal having a logic low level when the clock signal and the corresponding clock enable signal have different logic levels with respect to each other.

11. The memory system of claim 8, wherein each the enable signal buffer is configured to output activated internal clock enable signal when the corresponding decision signal is activated.

* * * * *